United States Patent
Yu et al.

(10) Patent No.: US 7,329,956 B1
(45) Date of Patent: Feb. 12, 2008

(54) DUAL DAMASCENE CLEANING METHOD

(75) Inventors: Chen-Hua Yu, Hsin-Chu (TW); Ching-Ya Wang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/519,625

(22) Filed: Sep. 12, 2006

(51) Int. Cl.
*H01L 23/58* (2006.01)
*H01L 23/52* (2006.01)

(52) U.S. Cl. ............... 257/758; 257/639; 257/642; 257/744; 257/745; 257/E21.151; 438/409; 438/788

(58) Field of Classification Search ............ 257/639, 257/642, 774, 775, E21.151; 438/409, 788
See application file for complete search history.

(56) References Cited

U.S. PATENT DOCUMENTS

| | | | |
|---|---|---|---|
| 6,013,581 A | 1/2000 | Wu et al. | |
| 6,171,951 B1* | 1/2001 | Lee et al. | 438/640 |
| 7,057,287 B2* | 6/2006 | Kumar et al. | 257/758 |
| 2003/0211746 A1* | 11/2003 | Chen et al. | 438/700 |
| 2004/0175928 A1* | 9/2004 | Abell | 438/627 |
| 2005/0067702 A1* | 3/2005 | America et al. | 257/753 |
| 2005/0082606 A1* | 4/2005 | Grunow et al. | 257/330 |
| 2005/0148209 A1* | 7/2005 | Chu et al. | 438/798 |
| 2005/0272237 A1* | 12/2005 | Hautala et al. | 438/597 |
| 2006/0027929 A1* | 2/2006 | Cooney et al. | 257/758 |
| 2006/0046472 A1* | 3/2006 | Sandhu et al. | 438/653 |
| 2006/0099802 A1* | 5/2006 | Lin et al. | 438/637 |
| 2006/0216932 A1* | 9/2006 | Kumar et al. | 438/641 |
| 2006/0261483 A1* | 11/2006 | Tsumura et al. | 257/758 |
| 2007/0202676 A1* | 8/2007 | Yeh et al. | 438/597 |

* cited by examiner

*Primary Examiner*—Scott B. Geyer
*Assistant Examiner*—Seahvosh Nikmanesh
(74) *Attorney, Agent, or Firm*—Slater & Matsil, L.L.P.

(57) ABSTRACT

A semiconductor structure having a pore sealed portion of a dielectric layer is provided. Exposed pores of the dielectric material are sealed using an anisotropic plasma so that pores along the bottom of the opening are sealed, and pores along sidewalls of the opening remain relatively untreated by the plasma. Thereafter, one or more barrier layers may be formed and the opening may be filled with a conductive material. The barrier layers formed over the sealing layer exhibits a more continuous barrier layer. The pores may be partially or completely sealed by plasma bombardment or ion implantation using a gas selected from one of $O_2$, an $O_2/N_2$ mixture, $H_2O$, or combinations thereof.

20 Claims, 4 Drawing Sheets

DUAL DAMASCENE CLEANING METHOD

TECHNICAL FIELD

This invention relates generally to semiconductor manufacturing and more particularly to the formation and processing of devices having porous dielectrics and damascene interconnect structures.

BACKGROUND

Size reduction of the semiconductor structures has provided significant improvement in the speed, performance, circuit density, and cost per unit function of semiconductor chips over the past few decades. As the density of semiconductor devices increases and the size of circuit elements becomes smaller, however, the resistance capacitance (RC) delay time increasingly dominates the circuit performance. To reduce the RC delay, there is a desire to switch from conventional dielectrics to low-k dielectrics for intermetal dielectrics, IMDs, and interlayer dielectrics, ILDs.

One example of low-k dielectrics are porous dielectrics such as the commercially available Dow Chemical's porous SILK product and JSR Corporation's JSR 5109. The dielectric constant of the porous material is a combination of the dielectric constant of the trapped gas, typically air, and the dielectric constant of the matrix material. Such materials may have pores as small as 5-10 nm and may achieve dielectric constants below about 3 or about 2.

Porous dielectrics present problems during processing, however. When there is an open surface pore, processing fluids can enter the dielectric and cause corrosion, mechanical damage, or increase the dielectric constant. Pore damage may also cause a surface that is preferably hydrophobic to become hydrophilic thereby causing absorption of moisture. It has also been observed that this degraded low-k dielectric material is more vulnerable to chemical attack during exposure to wet chemical cleanups.

Special pore damage problems arise with damascene interconnect formation. Damascene interconnect structures typically include copper as the interconnect conductor. Because of its high diffusivity and its tendency to act as a recombination center in silicon, steps must be taken to ensure that all the copper is confined to the damascene structure. This is conventionally accomplished with a barrier layer that lines the walls of the damascene interconnect trench and via. One problem is that a heavily damaged porous surface requires a thicker barrier layer to ensure that there are no thin patches through which copper could move. The thicker barrier layer, in turn, partially offsets the advantage of the low-k dielectric by increasing the resistance capacitance (RC) delay time.

In view of these and other problems, there is a need in semiconductor device manufacturing for methods to repair damaged porous dielectrics.

SUMMARY OF THE INVENTION

These and other problems are generally solved or circumvented, and technical advantages are generally achieved, by preferred embodiments of the present invention that provide a method for repairing low-k dielectrics suffering from pore damage.

In accordance with an embodiment of the present invention, a semiconductor structure is provided. The semiconductor structure comprises a trench in a porous dielectric. The trench has sidewalls and a bottom. The structure further comprises a pore sealed dielectric layer in the trench, wherein the thickness of the pore sealed dielectric layer at the bottom is at least about two times thicker than the thickness of the pore sealed dielectric layer at the sidewalls, if any.

In another aspect, the invention provides for a semiconductor structure comprising an opening formed in a porous dielectric. The opening may comprise a trench and a via. The trench has sidewalls and a bottom. A pore sealed dielectric layer is formed at the bottom of the trench. Preferably, the pore sealed layer is confined to the bottom of the trench, and there is minimal or no plasma treated layer along the sidewalls. In other embodiments, one or more barrier layers are formed along the sidewalls of the opening. A conductive material may fill the opening.

The pore sealed dielectric layer may be formed by plasma bombardment of the dielectric or by ion implantation of the dielectric. The implantation or bombardment preferably includes using a gas selected from the group consisting essentially of $O_2$, an $O_2/N_2$ mixture, $H_2O$, and combinations thereof. In embodiments of the invention, the plasma treated layer may comprise a higher carbon, nitrogen, or oxygen concentration than the dielectric layer.

Note that although the term layer is used throughout the specification and in the claims, the resulting features formed using the layer should not be interpreted as only a continuous or uninterrupted feature. As will be clear from reading the specification, the semiconductor layer may be separated into distinct and isolated features (e.g., active regions), some or all of which comprise portions of the semiconductor layer.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed herein are merely illustrative of specific ways to make and use the invention, and do not limit the scope of the invention.

Figure 1:
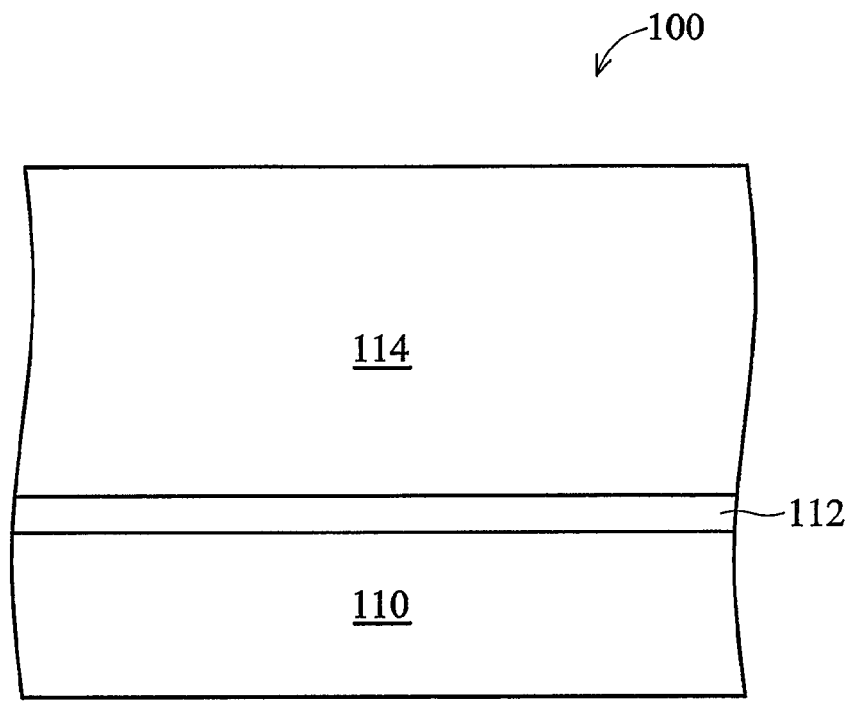
FIGS. 1 and 2 illustrate cross sectional views showing formation of a dual damascene trench and via according to embodiments of the invention.

Referring now to FIG. 1, a substrate 100 is provided having a conductive layer 110, an etch stop layer 112, and an IMD layer 114. Although it is not shown, the substrate may include circuitry and other structures. For example, the substrate 100 may have formed therein transistors, capacitors, resistors, interconnects and the like. In an embodiment, the conductive layer 110 is a metal layer that is in contact with electrical devices or another metal layer.

The conductive layer 110 may be formed of any conductive material, but an embodiment of the present invention has been found to be particularly useful in applications in which the conductive layer 110 is formed of copper. As discussed above, copper provides good conductivity with low resistance. The etch stop layer 112 provides an etch stop that may be used to selectively etch the IMD layer 114 in a later processing step. In an embodiment, the etch stop layer 112 may be formed of a dielectric material such as a silicon-containing material, a nitrogen-containing material, an oxygen-containing material, a carbon-containing material or the like. The IMD layer 114 is preferably formed of a low-k dielectric material.

Suitable low-k dielectrics include a carbon-doped silicon dioxide, also referred to as organo silicate glass (OSG) and C-oxide. A preferable thickness of the low-k dielectric 114 is between about 5000 Å and about 9000 Å, and it is preferably planarized. Exemplary organic low-k materials include polyarylene ether, hydrogen silsesquioxane (HSQ), methyl silsesquioxane (MSQ), polysilsequioxane, polyimide, benzocyclobutene, and amorphous polytetrafluoroethylene (PTFE). Other types of low-k materials include fluorinated silicate glass (FSG), SiN, SiO, spun-on-glass (SOG), plasma enhanced (PE) tetraethoxysilane (TEOS), halogenated SiO, and fluorinated silicate glass.

Other, more preferred, low-k dielectrics include a class of dielectrics that contain an unreacted, pore-generating material, or porogen. Heating the porogen above its decomposition temperature generates pores in the dielectric. By way of example, Dow Chemical's porous SILK product and JSR Corporation's JSR 5109 are suitable, commercially available low-k precursors that utilize an organic host material. In preferred embodiments, the low-k dielectric comprises Shipley's commercially available ZIRKON™ LK ILD. ZIRKON™ LK ILD is a blend of a methylsilsesquioxane (MSQ) based material with acrylic, polymer-based, nanoparticle porogen dispersed in a solvent (PGMEA). An alternative preferred low-k dielectric includes PECVD $Si_wO_x$-$C_yH_z$ because it has the potential to achieve k<2 either with or without a porogen.

ZIRKON™ LK ILD is preferably deposited using a conventional spin coater. After deposition, it is partially cured, preferably in a vertical furnace between about 250 and 300° C. in order to cross-link the matrix. Degradation of the ZIRKON™ LK ILD porogen begins at about 275° C., and complete degradation occurs at about 450° C.

Figure 2:
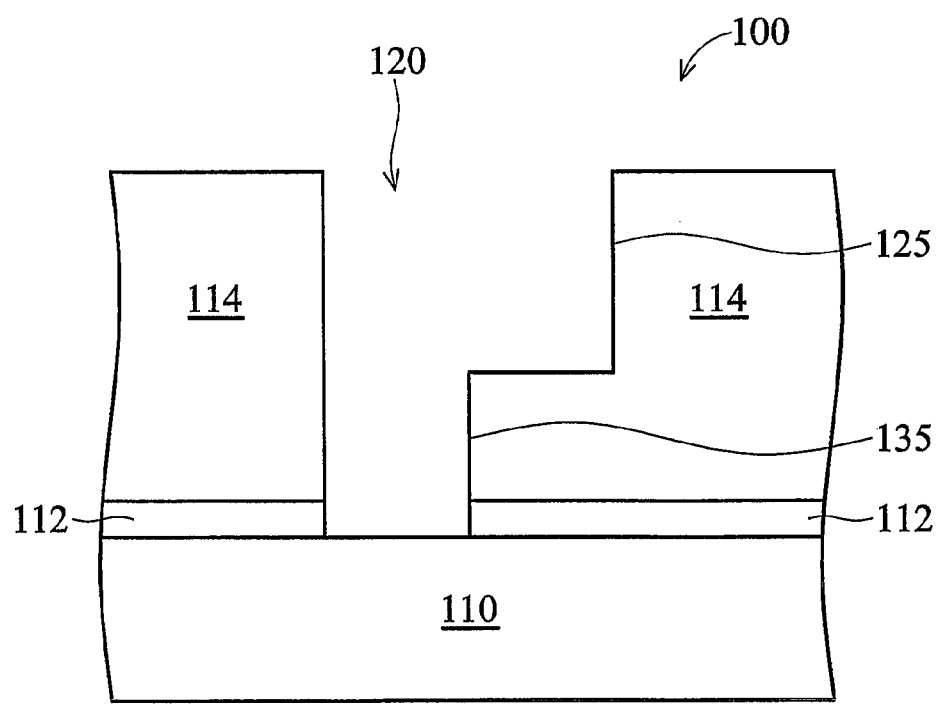

Referring now to FIG. 2, an opening 120 having a via 135 portion and a trench 125 portion are formed within the dielectric 114. While the trench 125 and via 135 are shown as forming a dual damascene structure, this is for illustrative purposes only. Embodiments of the invention are used with many other types of openings. It should also be noted that the damascene interconnect opening may be formed by one or more alternative process steps (e.g., a via first or a trench first damascene process).

In an embodiment the IMD layer 114 is formed of a blend of an MSQ and a polymer-based porogen. The IMD layer 114 may also comprise carbon-doped silicon dioxide. The etch stop layer 112 is formed of silicon nitride, and the conductive layer 110 is formed of copper, the opening 120 may be etched with, for example, $CF_4$, $C_5F_8$, $C_4F_8$, or a combination thereof, wherein the etch stop layer 112 acts as an etch stop. Thereafter, the underlying etch stop layer 112 may be etched with, for example, $CF_4$, thereby exposing the surface of the conductive layer 110.

In an embodiment the IMD layer 114 is formed of a blend of a MSQ and a polymer-based porogen. The IMD layer 114 may also comprise carbon-doped silicon dioxide. The etch stop layer 112 is formed of silicon nitride, and the conductive layer 110 is formed of copper, the opening 120 may be etched with, for example, $CF_4$, $C_5F_8$, $C_4F_8$, or the combination thereof, wherein the etch stop layer 112 acts as an etch stop. Thereafter, the underlying etch stop layer 112 may be etched with, for example, $CF_4$, thereby exposing the surface of the conductive layer 110.

Figure 3A:
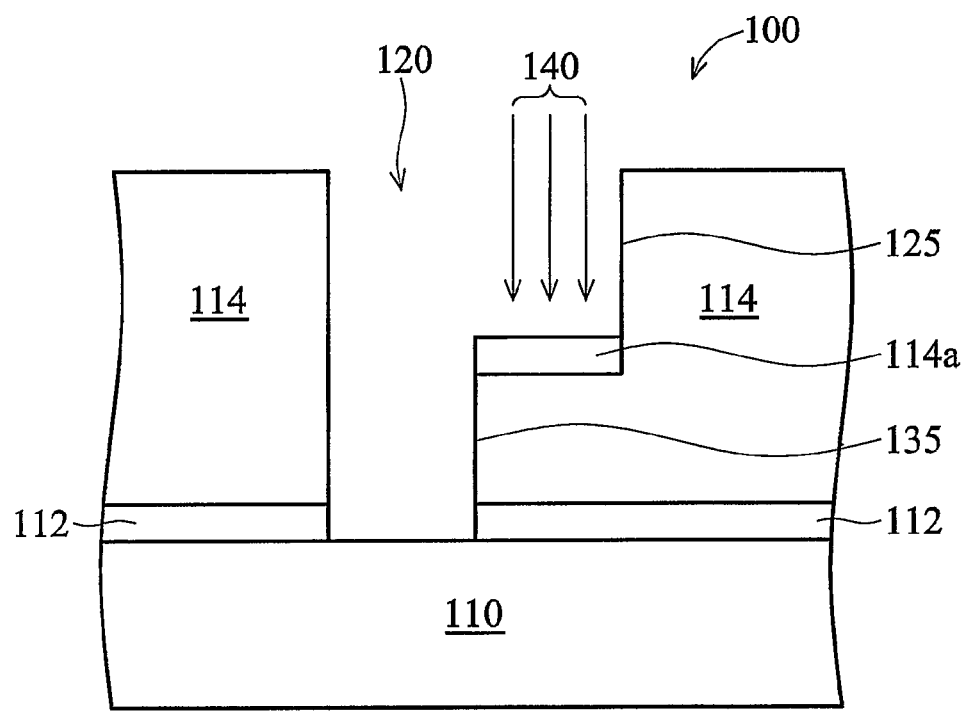
FIGS. 3a-3b illustrate the repair of a dielectric's damaged surface pores according to embodiments of the invention.

FIG. 3 illustrates the substrate 100 of FIG. 2 wherein in accordance with an embodiment of the present invention, one or more sealing processes may be performed to partially or completely seal the exposed pores of the IMD layer 114. Accordingly, FIG. 3 illustrates the substrate 100 of FIG. 2 having a pore-sealing process performed. The sealing process may be performed by exposing the substrate 100 to an anisotropic pore-sealing plasma 140, which is illustrated by arrows.

It should be noted that a pre-clean process may be performed to remove impurities along the sidewalls of the opening 120 and to clean the underlying conductive layer 110. The pre-clean process may be a reactive or a non-reactive pre-clean process. For example, a reactive process may include a plasma process using a hydrogen-containing plasma, and a non-reactive process may include a plasma process using an argon-containing or helium-containing plasma. The pre-clean process may be also a plasma process using a combination of the above gases containing plasma. The non-isotropic, i.e. vertical, plasma treatment 140 may be applied before a pre-clean process. Therefore, no additional mask layer is needed to confine the plasma effects to the bottom of the trench.

In an embodiment, the sealing process is performed by exposing the substrate to a plasma having a gas source. The plasma treatment will form a plasma treated portion 114a between about 10 Å and about 500 Å thick in the IMD layer 114. In preferred embodiments of the invention, the plasma treated portion 114a in the IMD layer 114 is substantially confined to the bottom of the trench 125 portion of the dual damascene interconnect 120 as shown in FIG. 3.

The anisotropic pore-sealing plasma 140 is used because the plasma treated portion 114a of the IMD layer 114 is preferably formed at the bottom of the opening 120 and not along the sidewalls. Applicants found that damage along the bottom of the opening 120 may be much greater than along the sidewalls with respect to intra-metal RC performance. Limiting the pore sealing process to the bottom of the opening reduces process integration problems. For example, applying a pore sealed layer over the sidewalls in addition to the bottom may degrade performance because the pore sealed layer sometimes unexpectedly causes uniformity or adhesion problems.

Figure 3B:
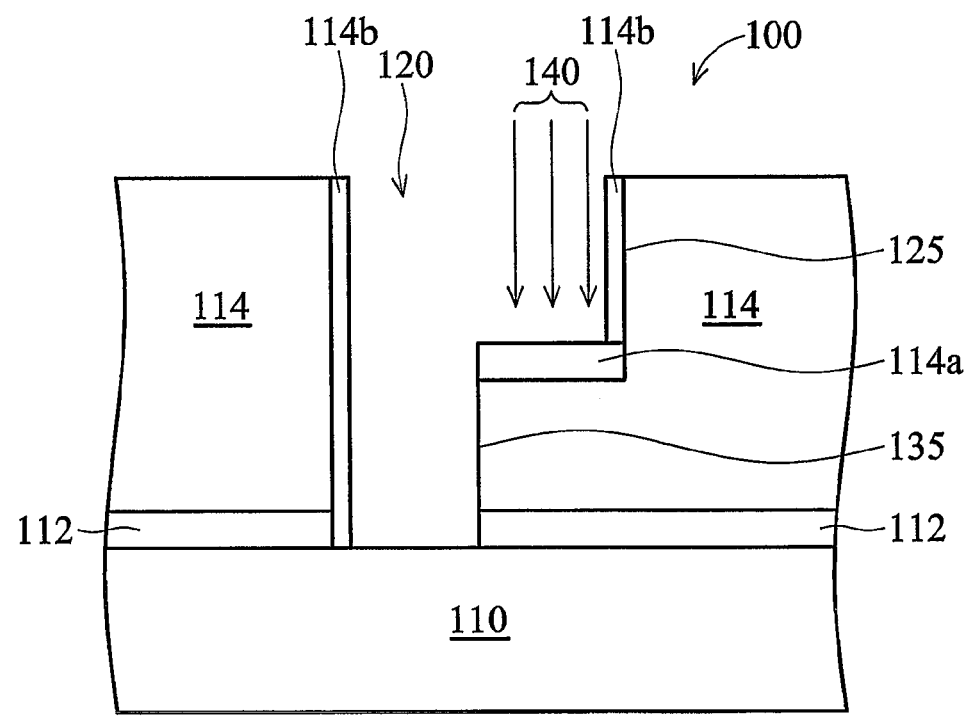

In an alternative embodiment, such as illustrated in FIG. 3b, pore sealing process 140 may result in a plasma treated portion 114a on the bottom of trench 125 and a plasma treated portion 114b on the sidewalls of trench 125. One skilled in the art will recognize the variations in plasma treatment processes that may result in sidewall plasma treated portions 114b. Such sidewall plasma treated portions 114b may be an intentional design element, or may be an inadvertent or unavoidable consequence of the plasma treatment process 140. It should be noted that, if a pore sealing process is applied at the trench and via sidewalls, other drawbacks, e.g. adhesion or uniformity issues, caused by such a pore sealed layer may arise and could lead to unexpectedly worse electrical performance. Preferably, then, the sidewall plasma treated portions 114b should be kept thin relative to the thickness of the bottom plasma treated portion 114a. Preferably, bottom plasma treated portion 114a is at least about two times thicker than sidewall plasma treated portion 114b.

The pores in the plasma treated portion 114a will be substantially sealed by the plasma treatment. The plasma treated portion (i.e., the pore sealed portion) 114a may contain a higher concentration of carbon, nitrogen, and/or oxygen than the bulk portion within the IMD layer 114. The plasma treated portion 114a may also comprise a carbonated, nitrogenated, and/or oxidized portion due to the plasma treatment. The pore sealing process may also density (i.e., increase the density) of the pore sealed layer 114a relative to the bulk portion within the IMD layer 114.

The plasma treatment may be performed at a time period of about 10 to about 100 seconds and a temperature of about 0° to about 400° C. with low RF energy of about 200 eV to about 800 eV with high RF energy of about 200 eV to about 800 eV with substrate bias about 0 to about 400 W. Examples of gas sources that may be used for the pore-sealing process include $Ar/H_2$, $Ar/N_2$, $Ar/He$, $H_2/He$, $H_2/N_2$, $Ar/O_2$, $O_2/N_2$. Other gases that may be used include an argon-containing gas, a hydrogen-containing gas, a nitrogen-containing gas, a helium-containing gas, an oxygen-containing gas, or a combination thereof. More preferably, the gas is selected from the group consisting essentially of $O_2$, an $O_2/N_2$ mixture, $H_2O$, and combinations thereof.

In another embodiment, the sealing process is an ion implantation process. Implanting a desired amount of specific species of ions at a distribution depth range can modify the materials or change or adjust characteristics of the target substrate. In the current application, O, N, or C are injected on the bottom of trench surface to reinforce the mechanical and chemical strength. Adjusting the dosage and energy of the implant species controls the thickness of the pore sealed layer 114a. The thickness may be between about 10 Å and about 200 Å. The implantation process may use one or more of the gases suitable for the plasma process.

Figure 4:
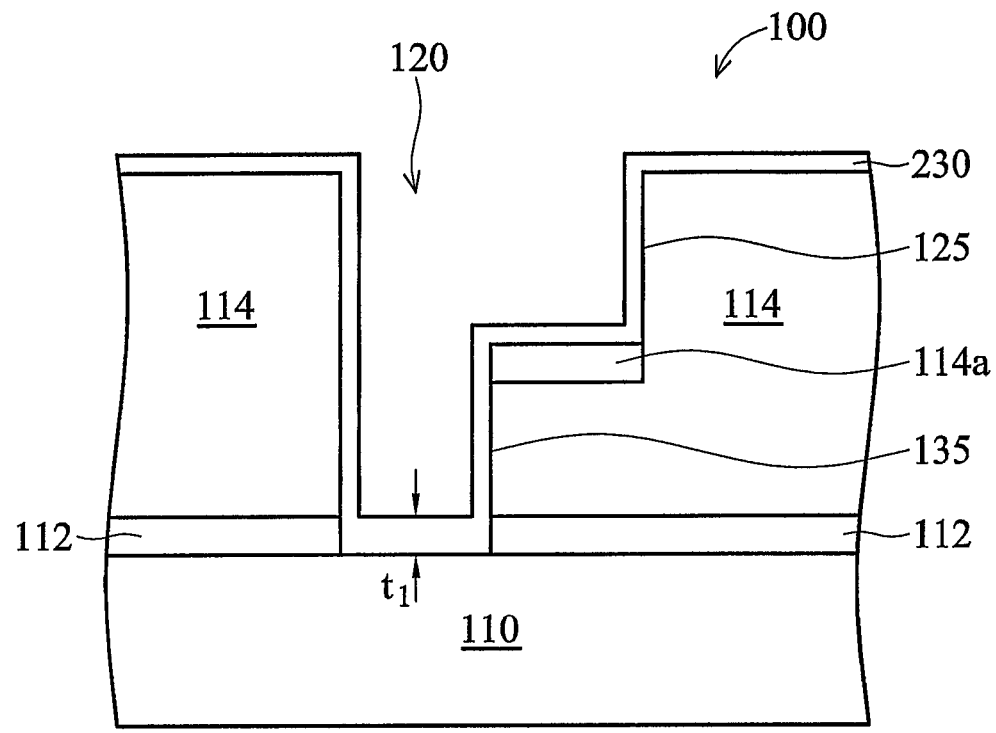
FIGS. 4 through 6 illustrate the completion of a damascene interconnect structure according to embodiments of the invention.

FIG. 4 illustrates the substrate 100 of FIG. 3 after a first barrier layer 230 has been formed. In an embodiment, the first barrier layer 230 may comprise a silicon-containing layer, carbon-containing layer, nitrogen-containing layer, hydrogen-containing layer, or a metal or a metal compound containing layer, such as tantalum, tantalum nitride, titanium, titanium nitride, titanium zirconium, titanium zirconium nitride, tungsten, tungsten nitride, alloys, or combinations thereof. The first barrier layer 230 may be formed by a process such as physical vapor deposition (PVD), chemical vapor deposition (CVD), plasma-enhanced CVD (PECVD), low-pressure CVD (LPCVD), atomic layer deposition (ALD), spin-on deposition, or other suitable methods. In an embodiment, the first barrier layer 230 is tantalum formed by a PVD process. The first barrier layer 230 may comprise multiple layers, and it may have an as-deposited thickness, $t_1$, at the bottom of the opening 120. The as-deposited thickness, $t_1$, may be between about 1 Å and about 100 Å.

As noted above, pore damage may be relatively low along a dielectric opening's sidewalls in comparison to the damage at the bottom of the opening. Because of the lower pore damage along sidewalls, the first barrier layer 230 provides suitable pore-sealing benefits along sidewalls in preferred embodiments of the invention. Other embodiments of the invention, however, may further include a uniform pore sealing process, which seals pores along the entire dielectric surface. The uniform pore sealing process may occur either before or after the non-uniform pore sealing process, depending, for example, upon integration issues.

Figure 5:
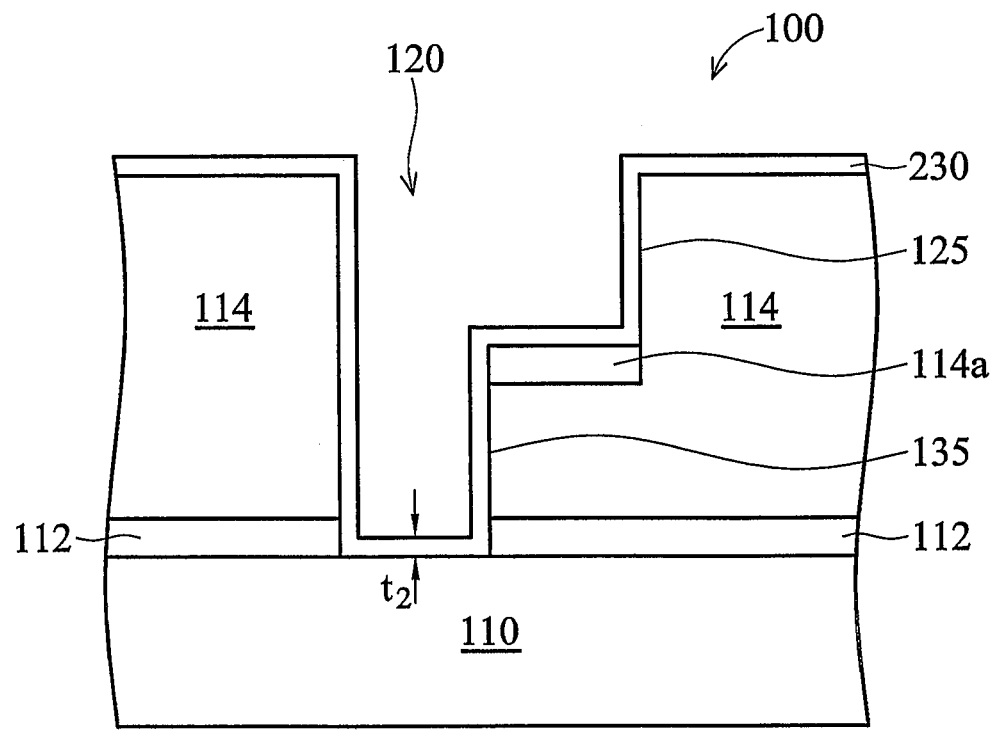

Referring now to FIG. 5, an optional process may be performed to completely or partially remove the first barrier layer 230 along the bottom of the opening 120. FIG. 5 illustrates an embodiment in which the first barrier layer 230 is partially removed. That is, the thickness at the bottom of the opening 120 is reduced to, $t_2$, as shown in FIG. 5. In another embodiment (not shown), the first barrier layer 230 may be completely removed, thereby exposing the underlying conductive layer 110. Completely or partially removing the first barrier layer 230 along the bottom of the opening 120 may be particularly useful in embodiments in which multiple barrier layers are used to provide diffusion and/or adhesion properties along the sidewalls, but fewer or thinner barrier layers are desired along the bottom to reduce contact resistance. It should also be noted that one or more additional barrier/adhesion barriers may be formed after removing the bottom portion of the first barrier layer 230. The bottom of the first barrier layer 230 may be removed by a dry or wet process.

Figure 6:
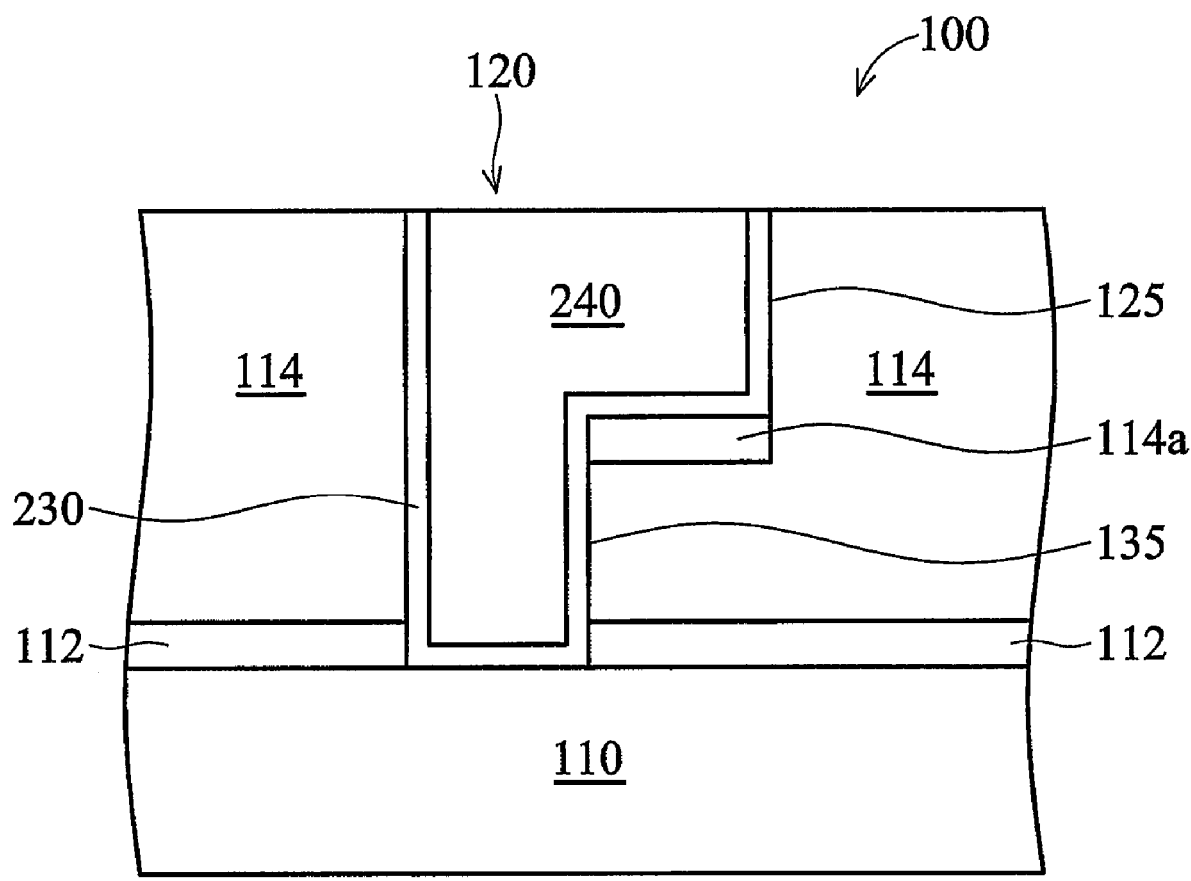

FIG. 6 illustrates the substrate 100 after the opening 120 is filled with a conductive plug 240 and the surface planarized. In an embodiment, the conductive plug 240 comprises a copper material formed by depositing a copper seed layer and forming a copper layer via an electro-plating process. The substrate 100 may be planarized by, for example, a chemical-mechanical polishing (CMP) process. Thereafter, standard processes may be used to complete fabrication and packaging of the semiconductor device.

It should be noted that the surface of the conductive layer 110 may be recessed in the opening 120 as a result of removing the first barrier layer 230 along the bottom of the opening 120. In an embodiment, the depth of the recess portion is less than about 800 Å.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a trench in a porous dielectric, the trench having sidewalls and a bottom; and
   a pore sealed dielectric layer in the trench, wherein the thickness of the pore sealed dielectric layer at the bottom is at least about two times thicker than the thickness of the pore sealed dielectric layer at the sidewalls.

2. The semiconductor structure of claim 1, wherein the pore sealed dielectric layer is formed by treating the porous dielectric.

3. The semiconductor structure of claim 2, wherein the treating includes plasma bombardment using a gas selected from a group consisting essentially of $O_2$, an $O_2/N_2$ mixture, $H_2O$, and combinations thereof.

4. The semiconductor structure of claim 3, wherein the plasma bombardment densifies a layer of the porous dielectric at the bottom of the trench.

5. The semiconductor structure of claim 2, wherein treating the porous dielectric includes ion implantation using a gas selected from the group consisting essentially of $O_2$, an $O_2/N_2$ mixture, $H_2O$, and combinations thereof.

6. The semiconductor structure of claim 1, wherein the pore sealed dielectric layer comprises a higher carbon concentration than the porous dielectric layer.

7. The semiconductor structure of claim 1, wherein the pore sealed dielectric layer is between about 10 Å and about 500 Å thick.

8. The semiconductor structure of claim 1, wherein there is substantially no pore sealed dielectric layer along at least portions of the sidewalls of the trench.

9. The semiconductor structure of claim 1, wherein the porous dielectric has a dielectric constant less than about 3.0.

10. The semiconductor structure of claim 1, wherein the trench is part of a dual damascene opening.

11. The semiconductor structure of claim 10, wherein the substrate further comprises a conductive layer underlying the dual damascene opening with a recess portion less than about 800 Å.

12. The semiconductor structure of claim 1 further comprising a conductor formed in the trench.

13. A semiconductor structure comprising:
    a porous dielectric layer on a substrate;
    an opening extending into the porous dielectric layer, the porous dielectric layer having a plasma treated portion on a bottom of the opening and not along sides of the opening;
    one or more barrier layers formed along the sidewalls of the opening; and
    a conductive material filling the opening.

14. The semiconductor structure of claim 13, wherein the plasma treated portion has a thickness along the bottom of the opening between about 10 Å and about 500 Å thick.

15. The semiconductor structure of claim 13, wherein the porous dielectric layer has a dielectric constant less than about 3.0.

16. The semiconductor structure of claim 13, wherein the plasma treated portion has a higher concentration of carbon than the porous dielectric layer.

17. The semiconductor structure of claim 13, wherein the plasma treated portion has a higher concentration of nitrogen than the porous dielectric layer.

18. The semiconductor structure of claim 13, wherein the plasma treated portion has a higher concentration of oxygen than the porous dielectric layer.

19. The semiconductor structure of claim 13, wherein the plasma treated portion has a higher density than the porous dielectric layer.

20. The semiconductor structure of claim 13, wherein the plasma treated portion is formed by plasma bombardment of a gas selected from a group consisting essentially of $O_2$, an $O_2/N_2$ mixture, and $H_2O$ and combinations thereof.

* * * * *

UNITED STATES PATENT AND TRADEMARK OFFICE
CERTIFICATE OF CORRECTION

PATENT NO.        : 7,329,956 B1
APPLICATION NO. : 11/519625
DATED             : February 12, 2008
INVENTOR(S)       : Yu et al.

It is certified that error appears in the above-identified patent and that said Letters Patent is hereby corrected as shown below:

In Col. 4, line 8, insert --The opening 120 may be formed by photolithography techniques known in the art. Generally, photolithography involves depositing a photoresist material and then irradiating (exposing) and developing in accordance with a specified pattern to remove a portion of the photoresist material. The remaining photoresist material protects the underlying material from subsequent processing steps, such as etching. The etching process may be a wet or dry, anisotropic or isotropic, etch process, but preferably is an anisotropic dry etch process. After the etching process, the remaining photoresist material may be removed.--.

In Col. 4, delete lines 18-27, "In an embodiment the IMD layer 114 is formed of a blend of a MSQ and a polymer-based porogen. The IMD layer 114 may also comprise carbon-doped silicon dioxide. The etch stop layer 112 is formed of silicon nitride, and the conductive layer 110 is formed of copper, the opening 120 may be etched with, for example, $CF_4$, $C_5F_8$, $C_4F_8$, or the combination thereof, wherein the etch stop layer 112 acts as an etch stop. Thereafter, the underlying etch stop layer 112 may be etched with, for example, $CF_4$, thereby exposing the surface of the conductive layer 110.".

In Col. 5, line 30, delete "density" and insert --densify--.

Signed and Sealed this

Tenth Day of June, 2008

JON W. DUDAS
*Director of the United States Patent and Trademark Office*